United States Patent
Bourstein et al.

(10) Patent No.: US 10,436,841 B2
(45) Date of Patent: Oct. 8, 2019

(54) USE OF WRAPPER CELLS TO IMPROVE SIGNAL ROUTING IN INTEGRATED CIRCUITS

(71) Applicant: Mellanox Technologies, Ltd., Yokneam (IL)

(72) Inventors: Ido Bourstein, Pardes Hana-Karkur (IL); Ofer Shalev, Yokneam Illit (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 15/879,479

(22) Filed: Jan. 25, 2018

(65) Prior Publication Data

US 2019/0227124 A1    Jul. 25, 2019

(51) Int. Cl.
*G01R 31/3185* (2006.01)
*G06F 17/50* (2006.01)
*G11C 29/48* (2006.01)
*G06F 11/22* (2006.01)

(52) U.S. Cl.
CPC ........ *G01R 31/318586* (2013.01); *G01R 31/31858* (2013.01); *G01R 31/318583* (2013.01); *G06F 11/2236* (2013.01); *G06F 17/5045* (2013.01); *G11C 29/48* (2013.01)

(58) Field of Classification Search
CPC .... G01R 31/318586; G01R 31/318583; G06F 17/5045
See application file for complete search history.

(56) References Cited

U.S. PATENT DOCUMENTS

| | | | | |
|---|---|---|---|---|
| 5,903,466 A | * | 5/1999 | Beausang | G01R 31/31704 716/104 |
| 6,199,183 B1 | * | 3/2001 | Nadaoka | G01R 31/31858 714/726 |
| 6,675,309 B1 | * | 1/2004 | Baxter | G06F 17/5045 713/401 |
| 2004/0040006 A1 | * | 2/2004 | Arakawa | G01R 31/3016 716/103 |
| 2004/0153978 A1 | * | 8/2004 | Xiang | G01R 31/318586 716/103 |

(Continued)

OTHER PUBLICATIONS

Edwards, C., "Panels see congestion and resistance dominate the leading-edge node battle", 3 pages, Jun. 21, 2017.

(Continued)

*Primary Examiner* — Joseph D Torres
(74) *Attorney, Agent, or Firm* — Kligler & Associates

(57) ABSTRACT

A method for circuit design includes providing one or more wrapper cells for use with a library of standard cells in design of an IC. Each wrapper cell has geometrical dimensions matching a corresponding group of one or more of the standard cells and defines an electrical path, including at least one via, from a location of a terminal in a lower metal layer in the standard cells in the corresponding group to a location in an upper metal layer. A computerized place-and-route tool receives a layout of the IC including a wrapper cell superimposed over one of the standard cells in the corresponding group. The place-and-route tool automatically routes a signal connection through the upper metal layer and the at least one via defined by the superimposed wrapper cell to the predefined signal terminal in the lower metal layer in the one of the standard cells.

19 Claims, 4 Drawing Sheets

(56) References Cited

U.S. PATENT DOCUMENTS

| | | | | |
|---|---|---|---|---|
| 2006/0048079 | A1* | 3/2006 | Dirks | G06F 17/5045 716/120 |
| 2006/0066357 | A1* | 3/2006 | Inoue | G01R 31/318583 326/93 |
| 2011/0181331 | A1* | 7/2011 | Srivastava | G06F 17/5045 327/215 |
| 2011/0221502 | A1* | 9/2011 | Meijer | G01R 31/318508 327/333 |
| 2012/0124439 | A1* | 5/2012 | Kim | G01R 31/31723 714/731 |
| 2013/0091483 | A1* | 4/2013 | Chen | G06F 17/5045 716/134 |

OTHER PUBLICATIONS

Cadence Design Systems Inc., "New Cadence Support of TSMC 7nm, 7nm+, and 12FFC", San Jose, California, 3 pages, year 2017.

* cited by examiner

USE OF WRAPPER CELLS TO IMPROVE SIGNAL ROUTING IN INTEGRATED CIRCUITS

FIELD OF THE INVENTION

The present invention relates generally to electronic circuit design tools, and specifically to methods, apparatus and software used in placement of components and routing of signal lines in an integrated circuit.

BACKGROUND

"Place and route" is a stage in the design of an integrated circuit (IC), which converts a circuit schematic, such as a netlist, into an actual layout that can be used in IC fabrication. In the placement step, the designer decides where to place the components of the circuit within the limited space available in the IC floorplan. The routing step then decides how to route conductors in order to make the necessary connections between the placed components.

In large-scale modern circuit designs, the placement and routing operations are usually performed by electronic design automation (EDA) tools, in accordance with instructions input by a specialist design engineer. For example, Synopsys, Inc. (Mountain View, Calif.), offers the IC Compiler™ place-and-route system, with capabilities for design planning, placement, clock tree synthesis, routing and optimization. Cadence Design Systems, Inc. (San Jose, Calif.), offers the Innovus™ Implementation System with similar capabilities. Engineers often use these EDA tools in conjunction with a library of predefined standard cells, which are provided by IC chip manufacturers and implement a range of predefined logic functions in the target technology of the IC under design.

SUMMARY

Embodiments of the present invention that are described hereinbelow provide methods, apparatus and software for automation of electronic circuit design.

There is therefore provided, in accordance with an embodiment of the invention, a method for circuit design, which includes providing one or more wrapper cells for use with a library of standard cells in design of an integrated circuit (IC). Each wrapper cell has geometrical dimensions matching the dimensions of a corresponding group of one or more of the standard cells in the library and defines an electrical path, including at least one via, from a first location of a predefined signal terminal in a lower metal layer in the standard cells in the corresponding group to a second location in an upper metal layer, which is to be deposited above the lower metal layer in fabrication of the IC. A computerized place-and-route tool receives a layout of the IC including an arrangement of at least some of the standard cells in the library and including a wrapper cell superimposed over one of the standard cells in the corresponding group. The computerized place-and-route tool, responsively to superimposed wrapper cell, automatically routes a signal connection through the upper metal layer and the at least one via defined by the superimposed wrapper cell to the predefined signal terminal in the lower metal layer in the one of the standard cells.

In some embodiments, providing the one or more wrapper cells includes providing a set of multiple different wrapper cells for different, respective groups of the standard cells. Typically, the different groups of the standards cells have different, respective dimensions, and the respective geometrical dimensions of the different wrapper cells are chosen to match the respective dimensions of the different groups of the standard cells. Additionally or alternatively, the different groups of the standards cells have signal terminals in different, respective locations, and the different wrapper cells have respective vias that are positioned so as to match the respective locations of the signal terminals in the different groups of the standard cells.

Further additionally or alternatively, providing the one or more wrapper cells includes defining a single wrapper cell for use with multiple, different standard cells in the corresponding group. In a disclosed embodiment, the different standard cells in the corresponding group have different, respective electrical properties while sharing the same dimensions and the same first location of the predefined signal terminal.

In another embodiment, providing the one or more wrapper cells includes providing, for a given group of the standard cells, at least first and second wrapper cells with respective vias reaching respective second locations in different, respective first and second upper metal layers.

In a disclosed embodiment, the predefined signal terminal is configured to drive a clock signal, which is conveyed through the at least one via. Additionally or alternatively, the at least one via includes a plurality of vias, which are arranged so as to define a via pillar in the IC.

There is also provided, in accordance with an embodiment of the invention, a method for circuit design, which includes designing a layout of an integrated circuit (IC) using a library of standard cells. A wrapper cell is selected and superimposed in the layout of the IC over one of the standard cells in the corresponding group. The layout, including the superimposed wrapper cell, is input to a computerized place-and-route tool, whereby the superimposed wrapper cell causes the place-and-route tool to automatically route a signal connection through the upper metal layer and the at least one via defined by the superimposed wrapper cell to the predefined signal terminal in the lower metal layer in the one of the standard cells.

There is additionally provided, in accordance with an embodiment of the invention, apparatus for circuit design, including a memory, which is configured to contain a library of standard cells for use in design of an integrated circuit (IC) and one or more wrapper cells for use with the library. A processor is configured to receive a layout of the IC, including an arrangement of at least some of the standard cells in the library and including a wrapper cell superimposed over one of the standard cells in the corresponding group, and to automatically route, responsively to superimposed wrapper cell, a signal connection through the upper metal layer and the at least one via defined by the superimposed wrapper cell to the predefined signal terminal in the lower metal layer in the one of the standard cells.

There is further provided, in accordance with an embodiment of the invention, a computer software product, including a non-transitory computer-readable medium in which program instructions are stored, which instructions, when read by a computer, cause the computer to access a memory containing a library of standard cells for use in design of an integrated circuit (IC) and one or more wrapper cells for use with the library. The instructions cause the computer to receive a layout of the IC including an arrangement of at least some of the standard cells in the library and including a wrapper cell superimposed over one of the standard cells in the corresponding group, and to automatically route, responsively to superimposed wrapper cell, a signal connection through the upper metal layer and the at least one via defined by the superimposed wrapper cell to the predefined signal terminal in the lower metal layer in the one of the standard cells.

The present invention will be more fully understood from the following detailed description of the embodiments thereof, taken together with the drawings in which:

DETAILED DESCRIPTION OF EMBODIMENTS

Overview

Figure 1:
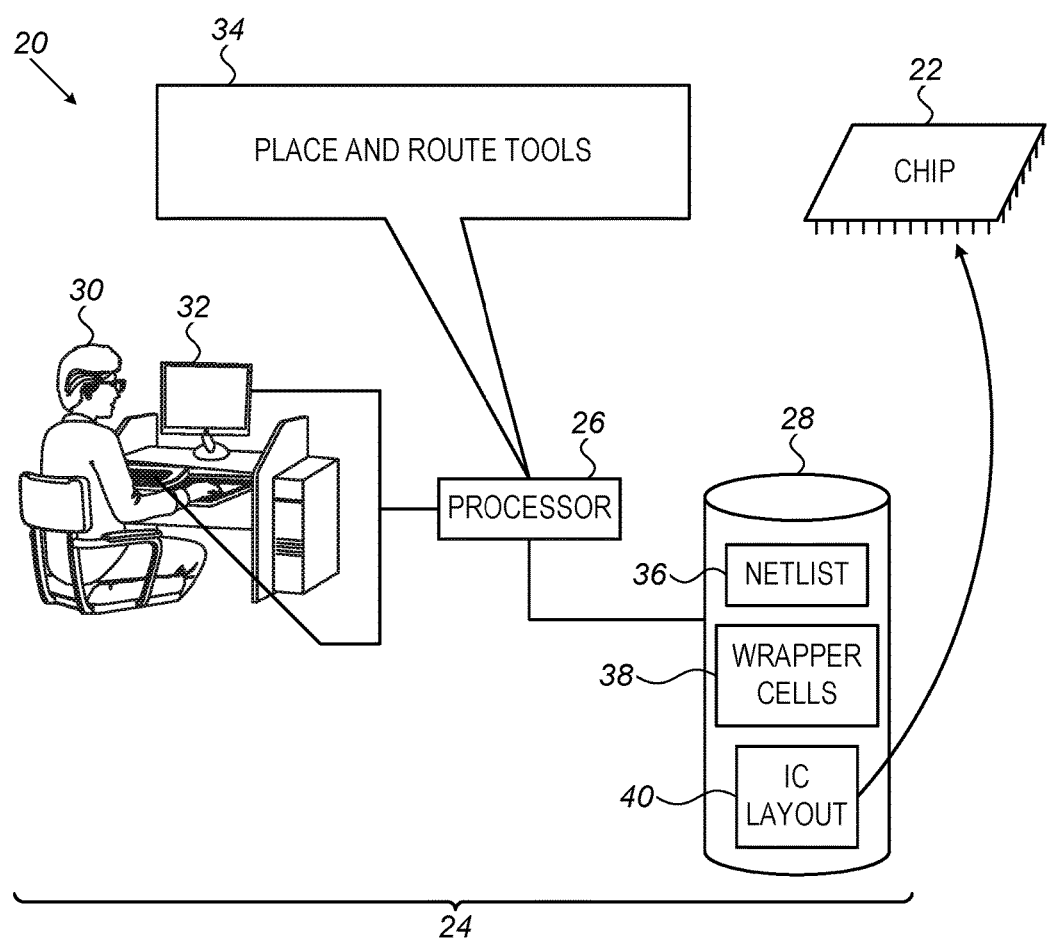
FIG. 1 is a block diagram that schematically illustrates a system for circuit design automation, in accordance with an embodiment of the invention.

In the place-and-route stage, the routing of high-speed signal lines, and particularly lines carry high-frequency clock signals, can have a critical effect on circuit performance. Signal paths that are narrow and convoluted tend to have high impedance, which can attenuate and delay the propagation of high-frequency signals passing over the paths. Furthermore, over time, these signal paths are susceptible to degradation due to electromigration, in which the movement of electrons causes gradual displacement of metal atoms from the conducting paths into surrounding areas of the chip. In consequence, the path resistance increases, sometimes to the point of an open circuit.

To mitigate the problem of high resistance and electromigration in lower metal layers and in the vias between layers in an IC, designers have begun to use a structure called a via pillar, also known as a via ladder. The via pillar is intended to improve current delivery in the connections between circuit components in the lower metal layers and interconnects that are formed in upper metal layers. Such via pillars are built up from closely-spaced pairs of vias that lie in the preferred routing direction for each metal layer, forming a lattice configuration with metal lines at locations where the via needs to pass through several metal interconnect layers.

Embodiments of the present invention that are described herein offer an automated solution to the problem of optimal routing of clock lines and other high-frequency signal paths, which reduces the implementation burden on the design engineer. The solution is based on a set of "wrapper cells," which are provided to the designer for use together with a library of standard cells in design of an IC. Each wrapper cell has a footprint that matches the footprint of a corresponding group of one or more of the standard cells in the library, i.e., the wrapper cell and corresponding standard cells have the same geometrical dimensions. The wrapper cell defines an electrical path between the location of a particular signal terminal in a lower metal layer in the standard cells in the corresponding group, and a certain location in an upper metal layer to which a connection is to be routed. For this purpose, the electrical path defined by the wrapper cell includes one or more vias, typically (though not necessarily) arranged to form a via pillar.

In order to direct a computerized place-and-route tool to automatically route a signal connection through an upper metal layer to a particular terminal in a lower metal layer in a given standard cell, the designer simply selects the appropriate wrapper cell and superimposes it on the standard cell in the circuit layout. The electrical path defined by the wrapper cell will cause the place-and-route tool to automatically route the signal connection through the upper metal layer and the via or vias defined by the wrapper cell, to the terminal in the lower metal layer in the standard cell. The designer is thus able to ensure that sensitive signals, such as clock signals, will be routed over paths with low resistance and low susceptibility to electromigration, without having to intervene manually in the actual routing process.

In the context of the present description and in the claims, the terms "lower metal layer" and "upper metal layer" should be understood as referring to any pair of metal layers deposited on the wafer in the course of fabrication of the IC, with the condition that the upper metal layer is deposited after the lower metal layer and is thus farther from the underlying wafer substrate.

Design libraries typically include groups of different standard cells with the same footprint and terminal locations. Such a group of standard cells may have different functional and/or electrical properties (for example, different voltage threshold (VT) characteristics or width of polysilicon structures). A single wrapper cell can be used interchangeably with any or all of the different standard cells in such a group.

To allow design flexibility and accommodate various design constraints, the set of wrapper cells can include multiple different wrapper cells for different, respective groups of the standard cells. These different groups may have different footprints and/or different signal terminal locations, and the different wrapper cells will have footprints and via positions that match the footprints and terminal locations in the corresponding groups. As long as the geometrical features and terminal locations of the standard cells remain the same, the designer can continue using the same wrapper cells even when the supplier of the standard cell library (typically a semiconductor fab operator) makes internal changes to the cells or adds new cells to the group. The library supplier can be relied upon to have tested and validated all standard cells before adding them to the library; thus, no additional validation is generally required in order to superimpose an existing wrapper cell on any corresponding standard cell in the library.

In some cases, multiple wrapper cells can be provided for a given group of standard cells, with respective vias connecting a terminal in the standard cells to locations in different upper metal layers, and/or using larger or smaller numbers of vias. The designer can then choose the wrapper cell depending upon the signal characteristics and other considerations that may dictate the optimal choice of upper layer and connection widths.

System Description

FIG. 1 is a block diagram that schematically illustrates a system 20 for design of an IC chip 22, in accordance with an embodiment of the invention. System 20 comprises a design automation station 24, which is built, in the illustrated embodiment, on a general-purpose computer, comprising at least one processor 26 and a memory 28. Alternatively, the functions of station 24 that are described herein may be distributed among multiple processors, on one, two or more separate computers. These functions of station 24 are typically implemented in software, which runs on processor 26. The software may be downloaded to station 24 in electronic form, over a network, for example. Additionally or alternatively, the software may be stored on non-transitory, tangible media, such as optical, magnetic or electronic memory media.

A user 30 of system 20, such as an IC chip designer, interacts with place-and-route tools 34 running on processor 26 to generate an IC layout 40 of the circuits in chip 22. Place-and-route tools 34 may comprise, for example, IC Compiler or Innovus software, as noted above, or other comparable software packages that are known in the art. In typical operation, place-and-route tools 34 receive a specification of the design of chip 22, for example in the form of a netlist 36 synthesized in an earlier stage of the circuit design (outside the scope of the present description) and generate an initial layout of the components in the chip. The layout typically uses standard cells selected from a particular design library, which is stored in memory 28 or in another repository.

User 30 operates a user interface 32 of station 24 to interact with place-and-route tools 34 and modify the layout as required in order to meet the specified requirements of chip 22. For example, user 30 may reposition cells in the layout in order to ensure that critical high-speed signals, such as clock signals, will be able to reach their destinations within specified time limits, over signal connections of sufficient width and low impedance to protect against degradation due to electromigration. In addition, in embodiments of the present invention, to ensure that these connections pass through low-impedance vias and upper metal layers, user 30 is able to select wrapper cells 38 from a set of wrapper cells held in memory 28, and to superimpose the selected wrapper cells over corresponding standard cells, as explained above. This process is described in greater detail with reference to the figures that follow.

User 30 inputs the modified layout, including the superimposed wrapper cells, to place-and-route tool 34. The presence of the superimposed wrapper cells causes the place-and-route tool to automatically route signal connections through the upper metal layers and vias defined by the wrapper cells to the appropriate signal terminals in the lower metal layers of the standard cells. Once IC layout 40 has been completed in this fashion and verified, this layout is used in producing the photolithographic masks for fabrication of chip 22. These latter steps are beyond the scope of the present description.

Although only a single user 30 is shown in FIG. 1 for the sake of simplicity, in practice the design of chip 22 is typically a collaborative effort, involving multiple engineers, who handle different aspects of the placement and routing stages in the physical design of the chip.

Design Process

Figure 2:
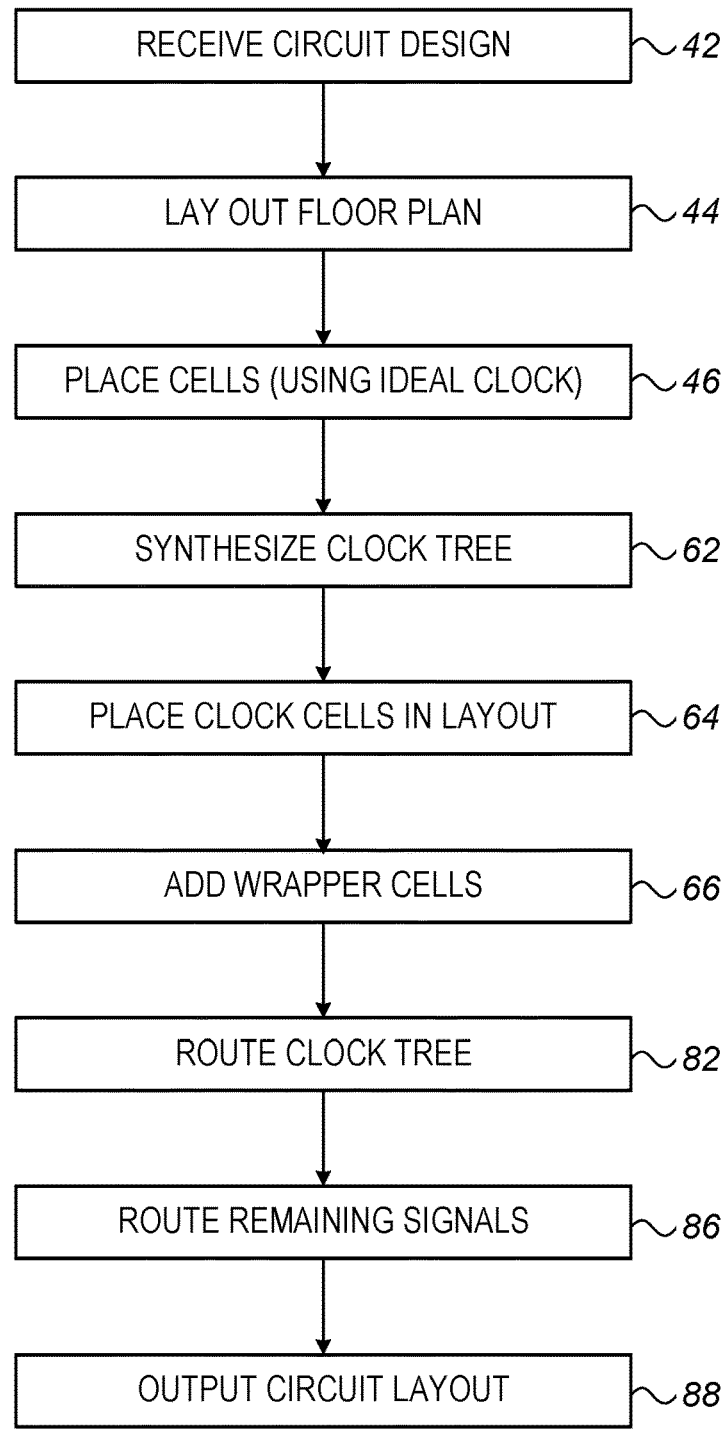
FIG. 2 is a flow chart that schematically illustrates a method for placement and routing of circuit elements in an IC design using wrapper cells, in accordance with an embodiment of the invention.

Reference is now made to FIGS. 2 and 3A-3E, which schematically illustrate a method for placement and routing of circuit elements in an IC design using wrapper cells, in accordance with an embodiment of the invention. FIG. 2 is a flow chart showing steps in the method, while FIGS. 3A-3E are schematic top views of a cell in the IC under design, illustrating successive stages in the method of FIG. 2. This method is described hereinbelow, for the sake of concreteness and clarity, with reference to the elements of system 20 (FIG. 1) and certain particular circuit components and structures that are shown in FIGS. 3A-3E. The principles of this method, however, are by no means limited to this particular environment and set of examples, and may alternatively be applied in other design environments, as well as using wrapper cells for other sorts of components, as will be apparent to those skilled in the art after reading the present description.

The method of FIG. 2 begins when station 24 receives a circuit design for layout, at a design input step 42. Typically, although not necessary, the design at this stage is in the form of netlist 36. User 30 interacts with place-and-route tools 34 to lay out a floorplan for chip 22, allocating areas of the chip for the various functions in the design, at a floor planning step 44. Processor 26 then selects and positions standard cells within the floorplan in order to implement the functional components of netlist 36, at a cell placement step 46. At this stage, signals that are to be distributed among the components of chip 22, including clock signals, are assumed to be ideal, i.e., signal propagation constraints are not generally taken into account in the cell placement.

Figure 3A:
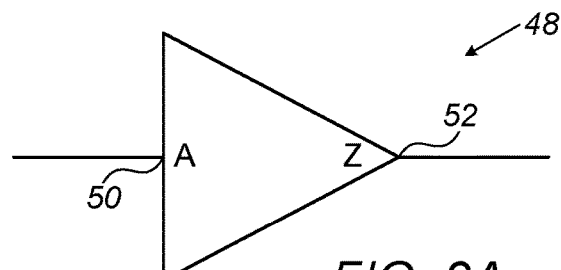
FIGS. 3A-3E are schematic top views of a cell in an IC under design, illustrating successive stages in the method of FIG. 2, in accordance with an embodiment of the invention.
Figure 3B:
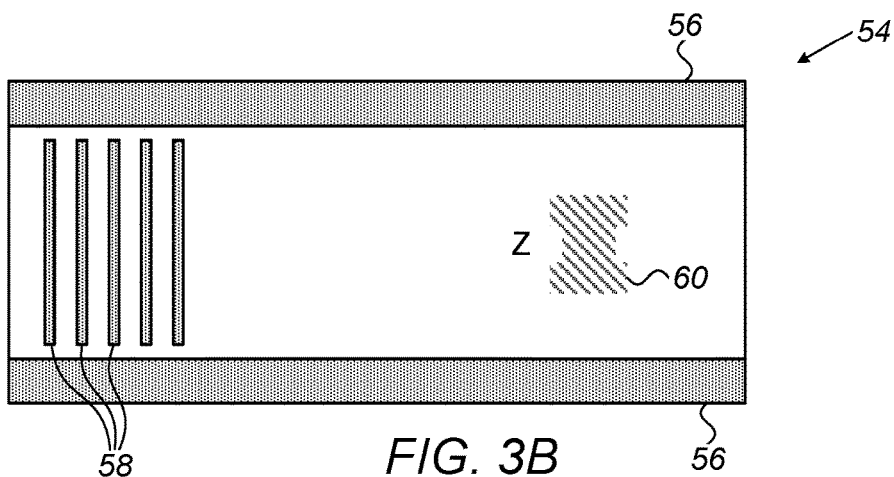

FIGS. 3A and 3B respectively show such a functional component, in this example a standard cell buffer 48, which is shown in symbol view in FIG. 3A, and a corresponding layout view of standard cell 54 shown in FIG. 3B. Buffer 48 has two terminals 50 and 52, labeled A and Z. The corresponding standard cell 54 layout view includes power and ground rails 56, which are typically formed in one of the lowest metal layers on chip 22, along with transverse metal connectors 58 to other components within the cell (not shown in the figures). Terminal 52 (Z) is represented in cell 54 by a pad 60 in a lower layer of the chip. According to the specification of cell 54, pad 60 is to drive a clock signal via a connection that will be routed through an upper metal layer in a subsequent stage of the place-and-route process.

After placement of the standard cells at step 46, processor 26 synthesizes the clock tree throughout chip 22, at a clock synthesis step 62. Processor 26 adds clock cells at appropriate locations in the layout in order to ensure that clock signals will reach their intended destinations with the appropriate timing and sufficient amplitude, at a clock cell placement step 64. This step can be directed interactively by user 30.

In addition, in order to optimize the quality of clock connections (and possibly other high-speed signal connections), user 30 superimposes wrapper cells on certain standard cells in the layout, at a wrapper cell addition step 66. As explained earlier, user 30 selects the appropriate wrapper cell for each standard cell that requires this sort of treatment, from among the set of wrapper cells 38 that is held in memory 28. To streamline operations, processor 26 may be programmed to automatically find all instances of a certain type of cell, such as cell 54, and then superimpose the appropriate wrapper cell on all such instances, or a certain selection of the instances.

Figure 3C:
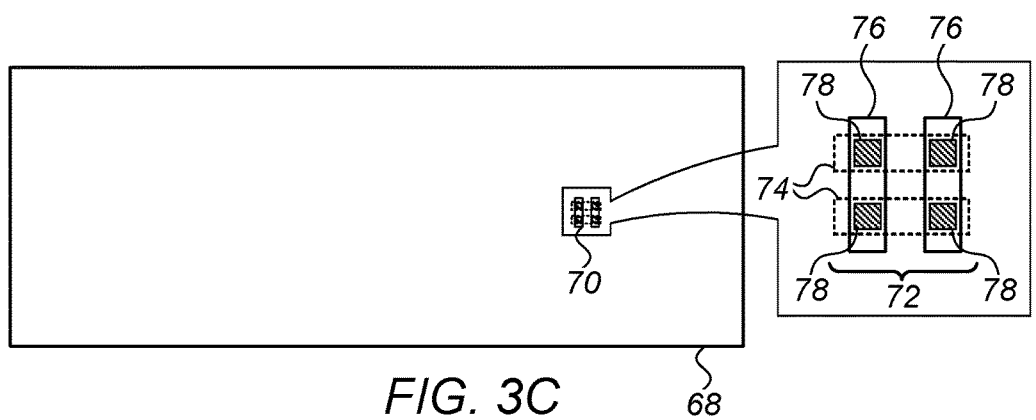

FIG. 3C, for example, shows a wrapper cell 68 for standard cell 54 (FIG. 3B). Wrapper cell 68 has the same geometrical dimensions, i.e., the same footprint, as cell 54 and contains a definition of an electrical path 70 from the lower layer in which pad 60 is located through to an upper metal layer of the chip design. As can be seen in the inset of FIG. 3C, path 70 comprises a via pillar 72, which is made up of closely-spaced metal lines 74, 76 in successive metal layers, interconnected by metal-filled vias 78 between the layers. Although only two metal layers are shown in the inset for the sake of simplicity, in practice metal lines 74, 76 and vias 78 can be formed through a succession of layers, thus creating a "ladder" through as many metal layers as is desired. As noted earlier, different wrapper cells can define via pillars of different heights.

Figure 3D:
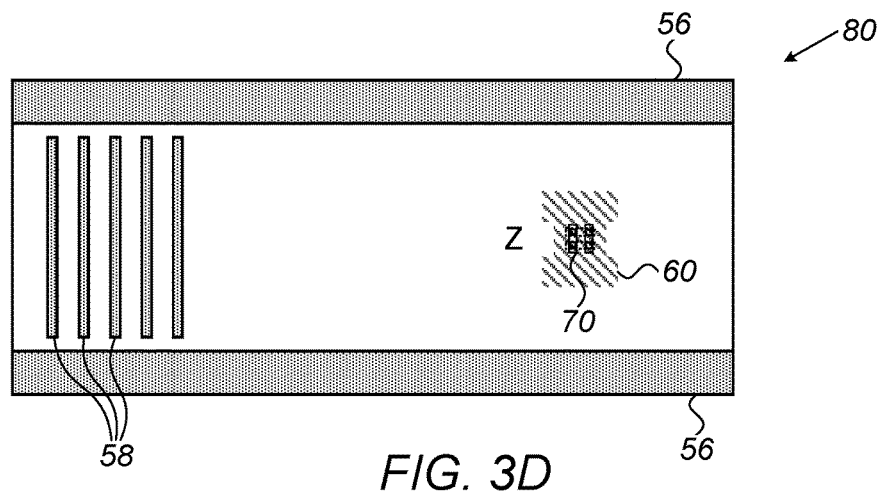

Superimposing wrapper cell 68 on standard cell 54 at step 66 creates a combined cell 80, as shown in FIG. 3D. Combined cell 80 has the functional and electrical properties of standard cell 54, with the addition of path for connection of pad 60 to the desired upper metal layer.

Figure 3E:
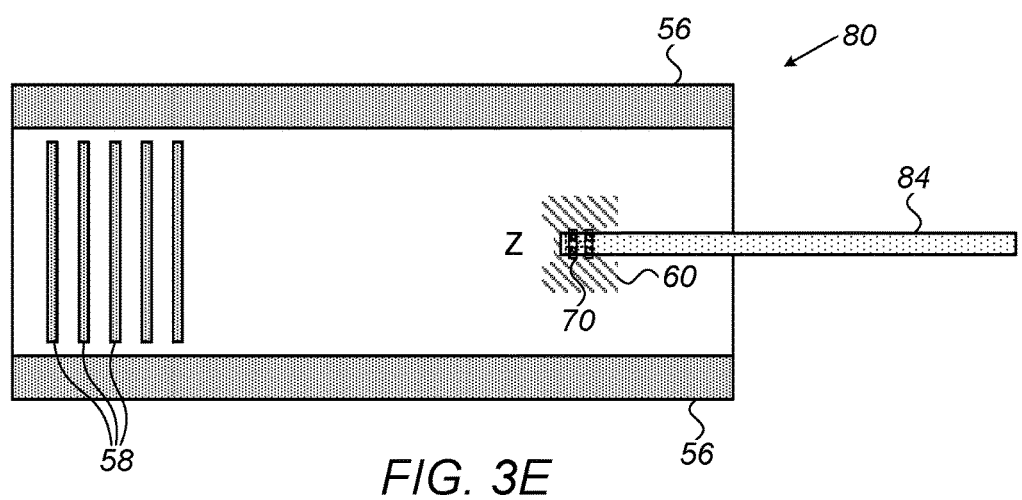

The modified layout, including clock cells and wrapper cells, is input to place-and-route tool 34, which automatically routes the clock tree among the cells, at a clock routing step 82. On the basis of path 70 in combined cell 80, the place-and-route tool will route a clock signal connection through the upper metal layer to connect with terminal 60 in standard cell 54. FIG. 3E illustrates a connection 84 of this sort. Connection 84 comprises a metal trace extending through the desired upper metal layer between an appropriate clock cell or cells (not shown) and the location of the upper end of via pillar 72. When chip is fabricated, it will include connection 84, metal lines 74, 76 and vias 78, thus making a clock connection to terminal 60 over a reliable, low-impedance path.

After routing of the critical clock connections, place-and-route tool 34 routes the remaining signal connections among the standard cells, at a signal routing step 86. At this point, IC layout 40 is ready for testing and mask generation, at an output step 88.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for circuit design, comprising:
providing one or more wrapper cells for use with a library of standard cells in design of an integrated circuit (IC), each wrapper cell having geometrical dimensions matching the dimensions of a corresponding group of one or more of the standard cells in the library and defining an electrical path, including at least one via, from a first location of a predefined signal terminal in a lower metal layer in the standard cells in the corresponding group to a second location in an upper metal layer, which is to be deposited above the lower metal layer in fabrication of the IC;
receiving, in a computerized place-and-route tool, a layout of the IC comprising an arrangement of at least some of the standard cells in the library and including a wrapper cell superimposed over one of the standard cells in the corresponding group; and
automatically routing by the computerized place-and-route tool, responsively to superimposed wrapper cell, a signal connection through the upper metal layer and the at least one via defined by the superimposed wrapper cell to the predefined signal terminal in the lower metal layer in the one of the standard cells.

2. The method according to claim 1, wherein providing the one or more wrapper cells comprises providing a set of multiple different wrapper cells for different, respective groups of the standard cells.

3. The method according to claim 2, wherein the different groups of the standards cells have different, respective dimensions, and wherein the respective geometrical dimensions of the different wrapper cells are chosen to match the respective dimensions of the different groups of the standard cells.

4. The method according to claim 2, wherein the different groups of the standards cells have signal terminals in different, respective locations, and wherein the different wrapper cells have respective vias that are positioned so as to match the respective locations of the signal terminals in the different groups of the standard cells.

5. The method according to claim 1, wherein providing the one or more wrapper cells comprises defining a single wrapper cell for use with multiple, different standard cells in the corresponding group.

6. The method according to claim 5, wherein the different standard cells in the corresponding group have different, respective electrical properties while sharing the same dimensions and the same first location of the predefined signal terminal.

7. The method according to claim 1, wherein providing the one or more wrapper cells comprises providing, for a given group of the standard cells, at least first and second wrapper cells with respective vias reaching respective second locations in different, respective first and second upper metal layers.

8. The method according to claim 1, wherein the predefined signal terminal is configured to drive a clock signal, which is conveyed through the at least one via.

9. The method according to claim 1, wherein the at least one via comprises a plurality of vias, which are arranged so as to define a via pillar in the IC.

10. Apparatus for circuit design, comprising:
a memory, configured to contain a library of standard cells for use in design of an integrated circuit (IC) and one or more wrapper cells for use with the library, each wrapper cell having geometrical dimensions matching the dimensions of a corresponding group of one or more of the standard cells in the library and defining an electrical path, including at least one via, from a first location of a predefined signal terminal in a lower metal layer in the standard cells in the corresponding group to a second location in an upper metal layer, which is to be deposited above the lower metal layer in fabrication of the IC; and
a processor, which is configured to receive a layout of the IC, comprising an arrangement of at least some of the standard cells in the library and including a wrapper cell superimposed over one of the standard cells in the corresponding group, and to automatically route, responsively to superimposed wrapper cell, a signal connection through the upper metal layer and the at least one via defined by the superimposed wrapper cell to the predefined signal terminal in the lower metal layer in the one of the standard cells.

11. A non-transitory computer-readable medium comprising program instructions, which instructions, when read by a computer, cause the computer to access a memory containing a library of standard cells for use in design of an integrated circuit (IC) and one or more wrapper cells for use with the library, each wrapper cell having geometrical dimensions matching the dimensions of a corresponding group of one or more of the standard cells in the library and defining an electrical path, including at least one via, from a first location of a predefined signal terminal in a lower metal layer in the standard cells in the corresponding group to a second location in an upper metal layer, which is to be deposited above the lower metal layer in fabrication of the IC,
wherein the instructions cause the computer to receive a layout of the IC comprising an arrangement of at least some of the standard cells in the library and including a wrapper cell superimposed over one of the standard cells in the corresponding group, and to automatically route, responsively to superimposed wrapper cell, a signal connection through the upper metal layer and the at least one via defined by the superimposed wrapper cell to the predefined signal terminal in the lower metal layer in the one of the standard cells.

12. The computer-readable medium according to claim 11, wherein the one or more wrapper cells are a part of a set of multiple different wrapper cells for different, respective groups of the standard cells.

13. The computer-readable medium according to claim 12, wherein the different groups of the standards cells have different, respective dimensions, and wherein the respective geometrical dimensions of the different wrapper cells are chosen to match the respective dimensions of the different groups of the standard cells.

14. The computer-readable medium according to claim 12, wherein the different groups of the standards cells have signal terminals in different, respective locations, and wherein the different wrapper cells have respective vias that are positioned so as to match the respective locations of the signal terminals in the different groups of the standard cells.

15. The computer-readable medium according to claim 11, wherein the one or more wrapper cells comprise a single wrapper cell for use with multiple, different standard cells in the corresponding group.

16. The computer-readable medium according to claim 15, wherein the different standard cells in the corresponding group have different, respective electrical properties while sharing the same dimensions and the same first location of the predefined signal terminal.

17. The computer-readable medium according to claim 11, wherein the one or more wrapper cells comprise, for a given group of the standard cells, at least first and second wrapper cells with respective vias reaching respective second locations in different, respective first and second upper metal layers.

18. The computer-readable medium according to claim 11, wherein the predefined signal terminal is configured to drive a clock signal, which is conveyed through the at least one via.

19. The computer-readable medium according to claim 11, wherein the at least one via comprises a plurality of vias, which are arranged so as to define a via pillar in the IC.

* * * * *